United States Patent
Yang

(10) Patent No.: US 11,041,098 B2
(45) Date of Patent: Jun. 22, 2021

(54) ANISOTROPIC CONDUCTIVE FILM AND FABRICATING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Hanning Yang, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 0 days.

(21) Appl. No.: 16/619,091

(22) PCT Filed: Mar. 25, 2019

(86) PCT No.: PCT/CN2019/079430
§ 371 (c)(1),
(2) Date: Dec. 4, 2019

(87) PCT Pub. No.: WO2020/103364
PCT Pub. Date: May 28, 2020

(65) Prior Publication Data
US 2020/0332155 A1   Oct. 22, 2020

(51) Int. Cl.
*C09J 9/02* (2006.01)
*H01B 3/48* (2006.01)
*H01L 23/00* (2006.01)

(52) U.S. Cl.
CPC .............. *C09J 9/02* (2013.01); *H01B 3/48* (2013.01); *C09J 2203/326* (2013.01); *C09J 2301/314* (2020.08); *C09J 2301/408* (2020.08); *C09J 2301/50* (2020.08); *H01L 24/29* (2013.01)

(58) Field of Classification Search
CPC ........................................................ C09J 9/02
See application file for complete search history.

(56) References Cited

U.S. PATENT DOCUMENTS

2012/0231260 A1*   9/2012   Kim ................... H05K 3/323
                                                                          428/327

* cited by examiner

*Primary Examiner* — William D Young
(74) *Attorney, Agent, or Firm* — Mark M. Friedman

(57) ABSTRACT

The anisotropic conductive film of the present invention includes a resin base tape and a plurality of composite fibers disposed laterally in the resin base tape, wherein each of the composite fibers includes an electrically insulating fiber and a plurality of conductive rings circling the electrically insulating fiber, the conductive rings including a plurality of conductive particles collectively surrounding the electrically insulating fiber by adsorption, wherein the plurality of composite fibers are periodically arranged in the resin base tape along the extending direction of the resin base tape, and the plurality of conductive rings on each of the composite fibers are periodically arranged along the axial direction of the electrically insulating fiber thereof.

6 Claims, 5 Drawing Sheets

S1 — forming a plurality of composite fibers periodically arranged, each of the composite fibers comprising an electrically insulating fiber and a plurality of conductive rings circling the electrically insulating fiber and arranged along an axial direction of the electrically insulating fiber, and the conductive rings comprising a plurality of conductive particles collectively surrounding the electrically insulating fiber by adsorption; and S2 — providing an adhesive to wrap the plurality of composite fibers to obtain a resin base tape, wherein the plurality of composite fibers are disposed laterally in the resin base tape periodically along an extending direction of the resin base tape.

FIG. 8

ANISOTROPIC CONDUCTIVE FILM AND FABRICATING METHOD THEREOF

BACKGROUND OF INVENTION

Field of Invention

The present invention relates to a field of display technology, and in particular, to an anisotropic conductive film and a method of fabricating the same.

Description of Prior Art

Flat display devices on the market include liquid crystal display (LCD) devices and active-matrix organic light emitting diode (AMOLED) display devices. AMOLED display devices have characteristics of self-illumination, high brightness, wide viewing angles, high contrast, flexibility, and low energy consumption, etc., thus receiving extensive attention and, as a new generation of display mode, gradually replacing traditional liquid crystal displays, and widely used in mobile phone screens, computer monitors, and full color TVs, etc.

An existing flat panel display generally includes a display panel and an external circuit. When the display panel is normally displayed, the external circuit such as a flexible printed circuit (FPC) or a chip on film (COF) is required to be connected to the outer lead bonding (OLB) area of the display panel by a lead to transmit a driving signal to each signal line in the display panel. The electrical connection between the external circuit and the OLB area of the display panel is completed by a bonding process. The bonding process is carried out using a pressing apparatus to connect the external circuit to the display panel by pre-bonding and bonding, such that an external electrode on the external circuit and an electrode line on the display panel are pressed together, and the conduction is realized by an anisotropic conductive film (ACF).

At present, common anisotropic conductive film products mainly include a thermosetting resin, conductive particles, a curing agent, a plasticizer and the like. When fabricating the anisotropic conductive film, the above components are first dissolved in a volatile solvent to prepare an anisotropic conductive adhesive, and the anisotropic conductive adhesive is applied to a plastic film, which is then subjected to hot air drying to remove the solvent to form the anisotropic conductive film. As shown in FIG. 1, the ACF 500 mainly includes an adhesive layer 510 and conductive particles 520 mixed in the adhesive layer 510. The conductive particles 520 provide electrical conductivity to the ACF 500, and the adhesive layer 510 provides adhesion properties and insulating properties to the ACF 500.

In a bonding process of the display panel, a display substrate and the external circuit respectively have a plurality of bumps as electrodes corresponding to each other, and an ACF is placed between the display substrate and the external circuit, and then subjected to hot pressing by a pressing apparatus to cause the ACF to react. Specifically, viscosity of the ACF is changed by heating, and the conductive particles in the ACF between the substrate and the external circuit are pressed to form an electrical connection between the display substrate and the external circuit.

With increasing demands for display technology, display devices with higher resolution have become popular in the display field. In order to achieve higher resolution display, the display devices are required to have more display units, and thus the number of lines of the driving circuit is correspondingly increased. In the bonding process, each bump should capture a certain number of conductive particles to achieve conduction. The low-density of the conductive particles limit the number of conductive particles distributed in each bump, and as shown in FIG. 1, the conductive particles in the existing ACF are randomly distributed, so that if each bump captures a certain amount of conductive particles, an area of each bump must be increased accordingly, which impacts the implementation of design of more drive lines.

SUMMARY OF INVENTION

An object of the present invention is to provide an anisotropic conductive film capable of achieving good bonding of electrode bumps having small areas, thereby realizing design of more drive lines on the display panel.

An object of the present invention is also to provide a method of fabricating an anisotropic conductive film, which can achieve a good bonding of electrode bumps having small areas, thereby realizing design of more drive lines on the display panel.

In order to achieve the above objects, the present invention provides an anisotropic conductive film including a resin base tape and a plurality of composite fibers disposed laterally in the resin base tape periodically along an extending direction of the resin base tape, wherein each of the composite fibers includes an electrically insulating fiber and a plurality of conductive rings circling the electrically insulating fiber and arranged along an axial direction of the electrically insulating fiber, and the conductive rings include a plurality of conductive particles collectively surrounding the electrically insulating fiber by adsorption.

The anisotropic conductive film further includes a separation layer disposed on upper and lower surfaces of the resin base tape.

The separation layer has a thickness of 2-3 μm.

Each of the conductive particles has a shape of a sphere, a cuboid, or a cone having an equivalent particle diameter of 5 to 100 nm.

The electrically insulating fiber has a length of 10-5000 μm.

Each of the conductive rings has a width of 50 to 1000 nm, and a space between two adjacent conductive rings of each of the composite fibers has a width of 500-5000 nm.

A space between two adjacent composite fibers in the resin base tape has a width of 1-10 μm.

The present invention also provides a method of fabricating an anisotropic conductive film, including the following steps:

Step S1, forming a plurality of composite fibers periodically arranged, each of the composite fibers including an electrically insulating fiber and a plurality of conductive rings circling the electrically insulating fiber and arranged along an axial direction of the electrically insulating fiber, and the conductive rings including a plurality of conductive particles collectively surrounding the electrically insulating fiber by adsorption; and Step S2: providing an adhesive to wrap the plurality of composite fibers to obtain a resin base tape, wherein the plurality of composite fibers are disposed laterally in the resin base tape periodically along an extending direction of the resin base tape.

Optionally, a process of fabricating the composite fibers in the step S1 specifically includes the following steps:

Step S11, providing the electrically insulating fiber and the conductive particles, performing surface modification on the electrically insulating fiber, so that the conductive particles are adsorbed on a surface of the electrically insulating fiber by electrostatic action to form a conductive layer covering the electrically insulating fiber;

Step S12, forming a masking pattern layer on a surface of the conductive layer, removing the conductive layer that is not covered by the masking pattern layer on the surface of the electrically insulating fiber, and forming the plurality of conductive rings circling the electrically insulating fiber and arranged along the axial direction of the electrically insulating fiber by a remaining portion of the conductive layer; and Step S13, removing the masking pattern layer to obtain the composite fiber.

Optionally, the process of fabricating the composite fibers in the step S1 specifically includes the following steps:

Step S11, providing the electrically insulating fiber, performing surface modification on the electrically insulating fiber, and forming a masking pattern layer on a surface of the electrically insulating fiber;

Step S12, providing the conductive particles, so that the conductive particles are adsorbed on the surface of the electrically insulating fiber that is not covered by the masking pattern layer by electrostatic action, to form the plurality of conductive rings circling the electrically insulating fiber and arranged along the axial direction of the electrically insulating fiber; and Step S13, removing the masking pattern layer to obtain the composite fiber.

Further, a step S3, forming a separation layer on upper and lower surfaces of the resin base tape, is included.

Advantageous effects of invention: The anisotropic conductive film of the present invention includes a resin base tape and a plurality of composite fibers disposed laterally in the resin base tape, wherein each of the composite fibers includes an electrically insulating fiber and a plurality of conductive rings circling the electrically insulating fiber, the conductive rings including a plurality of conductive particles collectively surrounding the electrically insulating fiber by adsorption, wherein the plurality of composite fibers are periodically arranged in the resin base tape along the extending direction of the resin base tape, and the plurality of conductive rings on each of the composite fibers are periodically arranged along the axial direction of the electrically insulating fiber thereof. Since the conductive rings are fixed on a surface of the electrically insulating fiber, the conductive rings and the electrically insulating fiber are not easily extruded outside of an electrode bump when the bonding is performed, and the electrode bump and the conductive rings may have good contact even when an area of the electrode bump is reduced. As such, more drive lines can be designed on the display panel, which can effectively improve resolution of a display panel. In the method of fabricating the anisotropic conductive film of the present invention, the prepared anisotropic conductive film can achieve a good bonding effect on the electrode bump having a small area, thereby realizing design of more drive lines on the display panel.

In order to further understand the features and technical contents of the present invention, please refer to the following detailed description and drawings related to the present invention. The drawings are provided for purposes of illustration and description only, and are not intended to limit the invention.

BRIEF DESCRIPTION OF DRAWINGS

The technical solutions and advantageous effects of the present invention will be apparent from the following detailed description of embodiments of the present invention with reference to the drawings.

In the drawings

FIG. 8 is a schematic flow chart of a method of fabricating an anisotropic conductive film according to the present invention.

DETAILED DESCRIPTION OF PREFERRED EMBODIMENTS

In order to further clarify the technical means and effects of the present invention, the following detailed description will be made in conjunction with the preferred embodiments and the accompanying drawings of the present invention.

Figure 3:
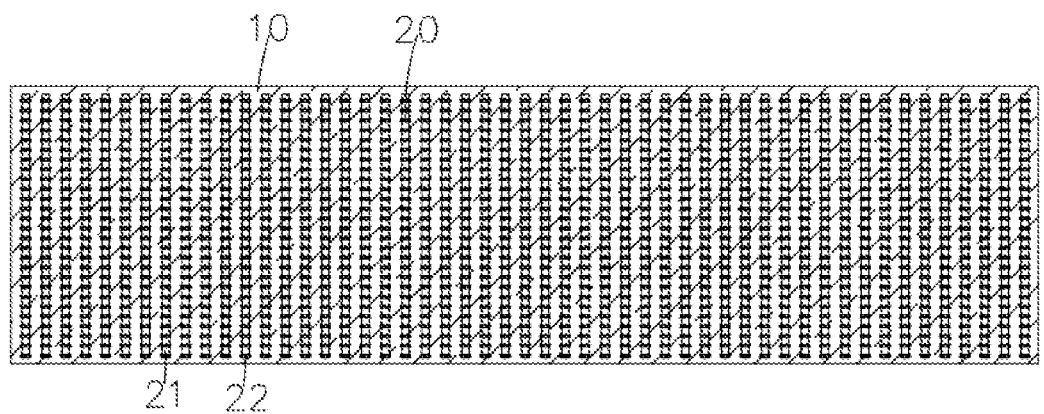
FIG. 3 is a schematic structural view of an anisotropic conductive film according to the present invention.

Referring to FIG. 3, the present invention provides an anisotropic conductive film including a resin base tape 10 and a plurality of composite fibers 20 disposed laterally in the resin base tape 10 periodically along an extending direction of the resin base tape 10.

Figure 1:
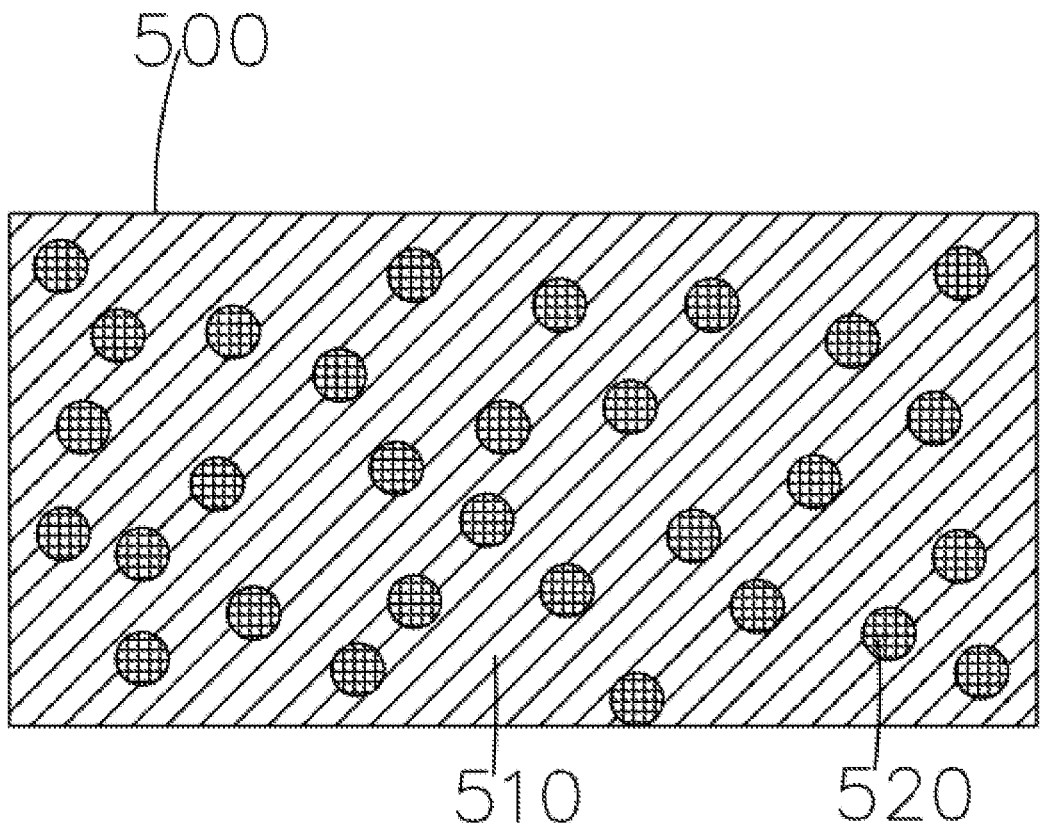
FIG. 1 is a schematic structural view of a conventional anisotropic conductive film.
Figure 2:
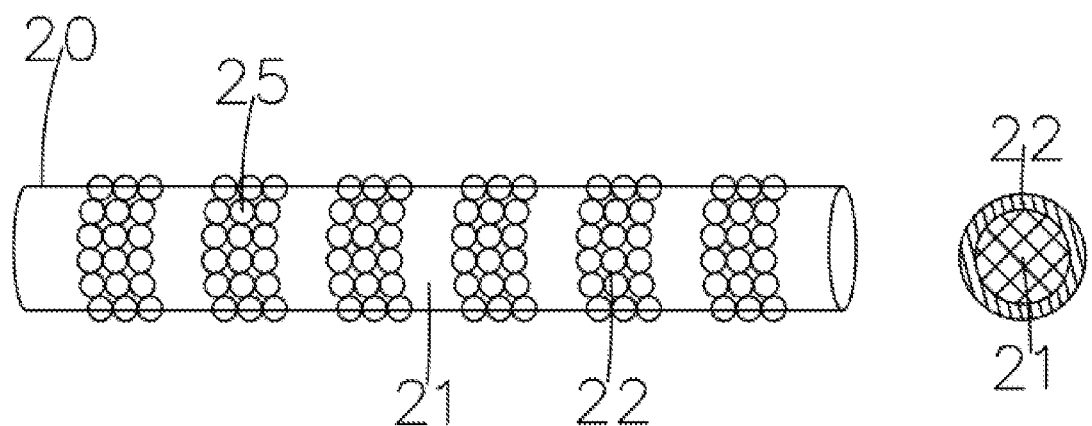
FIG. 2 is a schematic perspective view and a side view of a composite fibers in an anisotropic conductive film according to the present invention.

As shown in FIG. 2, each of the composite fibers 20 includes electrically insulating fibers 21 and a plurality of conductive rings 22 circling the electrically insulating fiber 21 and arranged along an axial direction of the electrically insulating fiber 21.

The conductive rings 22 include a plurality of conductive particles 25 that collectively surround the electrically insulating fiber by adsorption.

Figure 4:
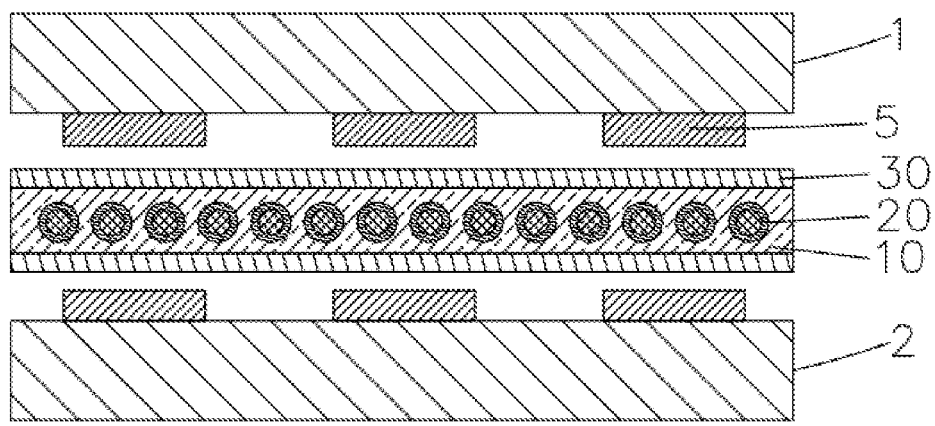
FIG. 4 is a schematic view showing an arrangement between a display substrate and an external circuit before bonding of an anisotropic conductive film according to the present invention.
Figure 5:
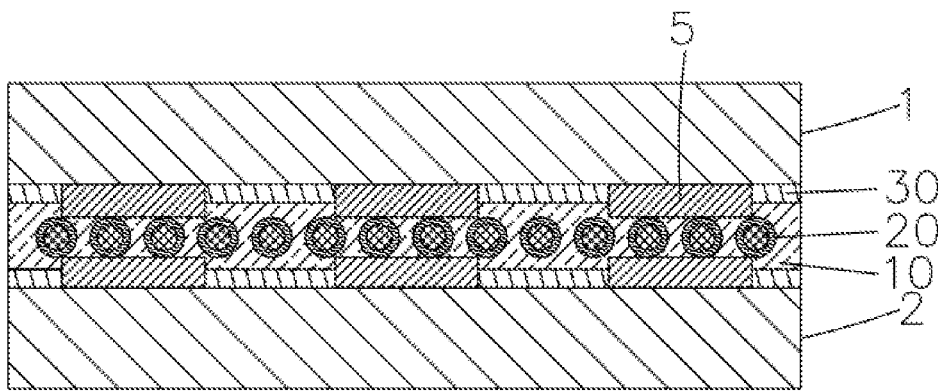
FIG. 5 is a schematic view showing an electrical connection between the display substrate and the external circuit after bonding of an anisotropic conductive film according to the present invention.
Figure 6:
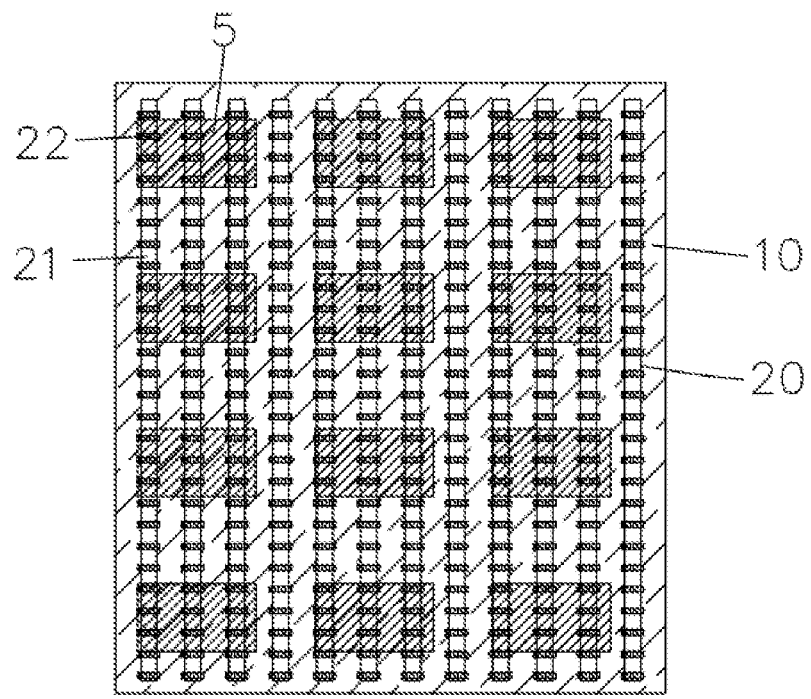
FIG. 6 is a top plan view showing bonding of an anisotropic conductive film to laterally arranged electrode bumps according to the present invention.
Figure 7:
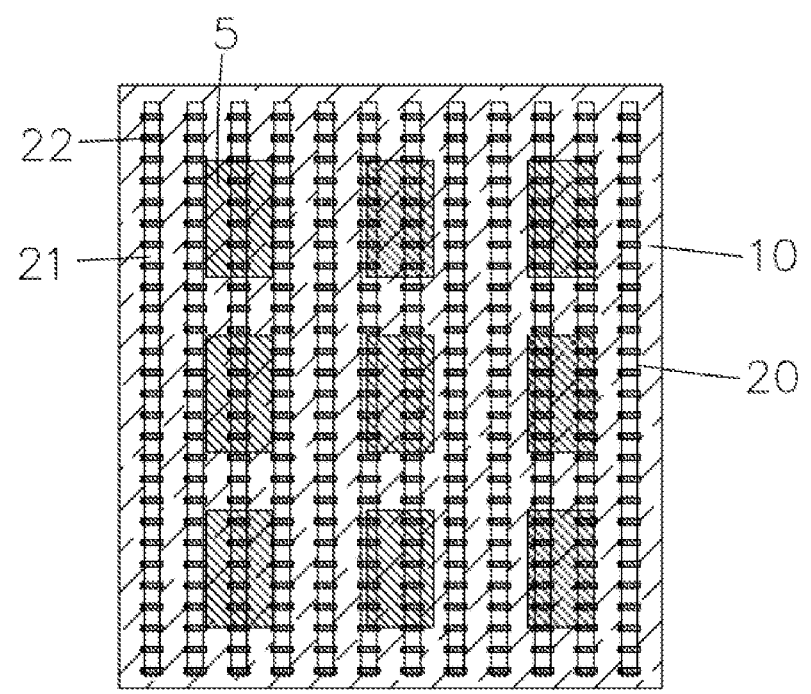
FIG. 7 is a top plan view showing bonding of an anisotropic conductive film to longitudinally arranged electrode bumps according to the present invention.

It should be noted that, as shown in FIGS. 4-5, when the anisotropic conductive film of the present invention is used for bonding the display substrate 1 and the external circuit 2, the electrode bumps 5 on an upper side and a lower side of the anisotropic conductive film are both in contact with the conductive rings 22, thereby achieving conduction of the electrode bumps 5 on the upper and lower sides. Further, since the composite fibers 20 are sufficiently long in a direction perpendicular to the resin base tape 10, that is, in a width direction of the resin base tape 10, the composite fibers 20 are not easily moved like the conductive particles in a conventional anisotropic conductive film (ACF) during the bonding process, thereby ensuring that the composite fibers 20 under the electrode bumps 5 are not easily pressed outside. In addition, since the composite fibers 20 in the resin base tape 10 are separated from each other, short-circuiting between the two adjacent electrode bumps 5 due to mutual contact of the composite fibers 20 does not occur. Each of the electrode bumps 5 is in contact with the plurality of conductive rings 22 on the composite fibers 30, so that the electrode bumps 5 on the upper and lower sides are well-conducted. Further, since the conductive rings 22 are separated from each other, short-circuiting between the electrode bumps 5 perpendicular to an extending direction of the resin base tape 10 due to contact with the conductive rings 22 at the same time does not occur. FIGS. 6-7 are top plan views showing the anisotropic conductive films used for bonding the electrode bumps of different arrangements, and contact between the laterally or longitudinally arranged electrode bumps 5 and a plurality of conductive rings 22 can be realized. Since the conductive rings 22 are periodically and densely arranged, when sizes of the electrode bumps 5 are reduced, each of the electrode bumps 5 can still be in contact with the conductive rings 22, so that design of more drive lines on the display panel can be realized, thereby effectively improving resolution of the display panel.

Specifically, the anisotropic conductive film of the present invention further includes a separation layer 30 disposed on the upper and lower surfaces of the resin base tape 10. The separation layer 30 can better prevent short circuit due to the contact between the different electrode bumps 5 and the composite fibers 20 when bonding, but a thickness of the separation layer 30 is sufficiently thin, being 2-3 µm, so that the conductive particles 25 on the composite fibers 20 can pierce the separation layer 30 for electrical connection when bonding.

Specifically, each of the conductive particles 25 may have a shape of a sphere, a cuboid, or a cone, etc.

Specifically, the conductive particles 25 are nano-sized particles having equivalent particle diameters of 5 to 100 nm.

Specifically, the electrically insulating fiber 21 has a length of 10 to 5000 µm.

Specifically, each of the conductive rings 22 has a width of 50 to 1000 nm, and a space between two adjacent conductive rings 22 of each of the composite fibers 20 has a width of 500-5000 nm.

Specifically, a space between two adjacent composite fibers 20 in the resin base tape 10 has a width of 1-10 µm.

Specifically, a surface of the electrically insulating fiber 21 is subjected to a modification treatment. For example, a surface thereof is positively charged, so that the conductive particles 25 are adsorbed on the surface of the electrically insulating fiber by electrostatic action.

The anisotropic conductive film of the present invention includes a resin base tape 10 and a plurality of composite fibers 20 disposed laterally in the resin base tape 10, wherein each of the composite fibers 20 includes an electrically insulating fibers 21 and a plurality of conductive rings 22 circling the electrically insulating fibers 21, the conductive rings 22 including a plurality of conductive particles 25 collectively surrounding the electrically insulating fiber 21 by adsorption, wherein the plurality of composite fibers 20 are periodically arranged in the resin base tape 10 along the extending direction of the resin base tape 10, and the plurality of conductive rings 22 on each of the composite fibers 20 are periodically arranged along the axial direction of the electrically insulating fiber 21 thereof, thereby effectively controlling the distribution of the conductive rings 22. Since the conductive rings 22 are fixed on a surface of the electrically insulating fiber 21, and the composite fibers 20 is sufficiently long, the conductive rings 22 and the electrically insulating fiber 21 are not easily extruded outside of an electrode bump when the bonding is performed, and the electrode bump and the conductive rings 22 may have good contact even when an area of the electrode bump is reduced. As such, more drive lines can be designed on the display panel, which can effectively improve resolution of a display panel.

As shown in FIG. 8, the present invention further provides a method of fabricating an anisotropic conductive film based on the above-mentioned anisotropic conductive film. The first embodiment of the method of fabricating the anisotropic conductive film of the present invention specifically includes the following steps:

Step S1, forming a plurality of composite fibers 20 periodically arranged.

Each of the composite fibers 20 includes an electrically insulating fiber 21 and a plurality of conductive rings 22 rings circling the electrically insulating fiber and arranged along an axial direction of the electrically insulating fiber 21, wherein the conductive rings 22 include a plurality of conductive particles 25 collectively surrounding the electrically insulating fiber 21 by adsorption.

Specifically, each of the conductive particles 25 has a shape of a sphere, a cuboid or a cone.

Specifically, the conductive particles 25 are nano-sized particles having an equivalent particle diameter of 5 to 100 nm.

Specifically, the electrically insulating fiber 21 has a length of 10 to 5000 µm.

Specifically, each of the conductive rings 22 has a width of 50 to 1000 nm, and a space between two adjacent conductive rings 22 of each of the composite fibers 20 has a width of 500-5000 nm.

Figure 9:
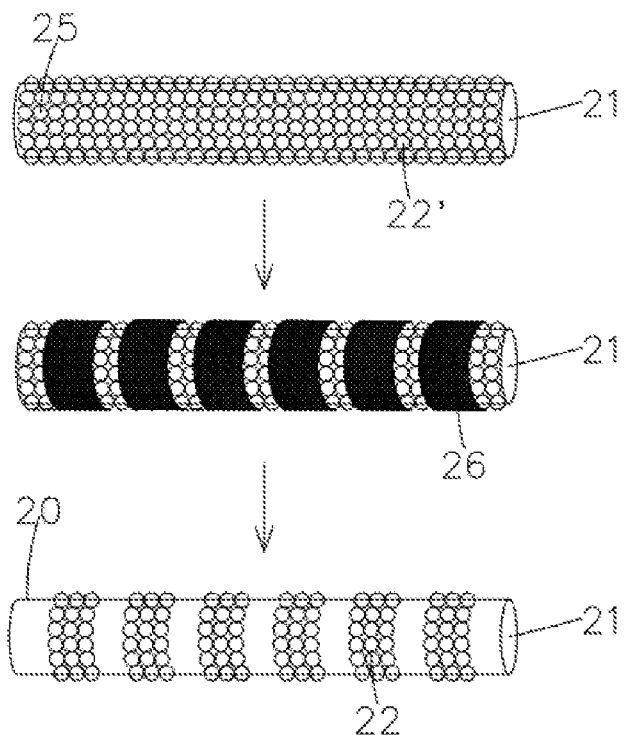
FIG. 9 is a schematic view showing a step S1 of a method of fabricating the anisotropic conductive film according to the first embodiment of the present invention.

As shown in FIG. 9, the process of fabricating the composite fibers 20 in the step S1 of this embodiment specifically includes the following steps:

Step S11, providing the electrically insulating fiber 21 and conductive particles 25, and performing surface modification on the electrically insulating fiber 21, so that the conductive particles 25 are adsorbed on a surface of the electrically insulating fiber 21 by electrostatic action to form a conductive layer 22' covering the electrically insulating fiber 21.

Step S12, forming a masking pattern layer 26 on a surface of the conductive layer 22', removing the conductive layer 22' that is not covered by the masking pattern layer 26 on the surface of the electrically insulating fiber 21, and forming the plurality of conductive rings 22 circling the electrically insulating fiber and arranged along the axial direction of the electrically insulating fiber 21 by a remaining portion of the conductive layer 22'.

Specifically, the masking pattern layer 26 is a photoresist material and can be formed by a photolithography process.

Specifically, the conductive rings 22 have shapes depending on a shape of a cross-section of the electrically insulating fiber 21, for example, a circular shape.

Step S13, removing the masking pattern layer 26 to obtain the composite fiber 20.

Step S2: providing an adhesive to wrap the plurality of composite fibers 20 to obtain a resin base tape 10, wherein the plurality of composite fibers 20 are disposed laterally in the resin base tape 10 periodically along an extending direction of the resin base tape 10.

Specifically, a space between two adjacent composite fibers 20 in the resin base tape 10 has a width of 1-10 μm.

Step S3 forming a separation layer 30 on upper and lower surfaces of the resin base tape 10. The separation layer 30 can better prevent short circuit due to the contact between the different electrode bumps 5 and the composite fibers 20 when bonding, but a thickness of the separation layer 30 is sufficiently thin, being 2-3 μm, so that the conductive particles 25 on the composite fibers 20 can pierce the separation layer 30 and be electrically connected when bonding.

The present invention further provides a second embodiment of the method of fabricating the anisotropic conductive film. A difference between the second and the first embodiments of the methods of fabricating the anisotropic conductive film of the present invention is that in the step S1 of the first embodiment, the conductive layer 22 is formed of the conductive particles 25, and then the conductive layer 22' is patterned to obtain the conductive rings 22; while in the step S1 of the second embodiment, the masking pattern layer 26 is formed on the surface of the electrically insulating fiber 21, and then conductive rings 22 are directly formed on a surface of the electrically insulating fiber 21 that is not covered by the masking pattern layer 26.

Figure 10:
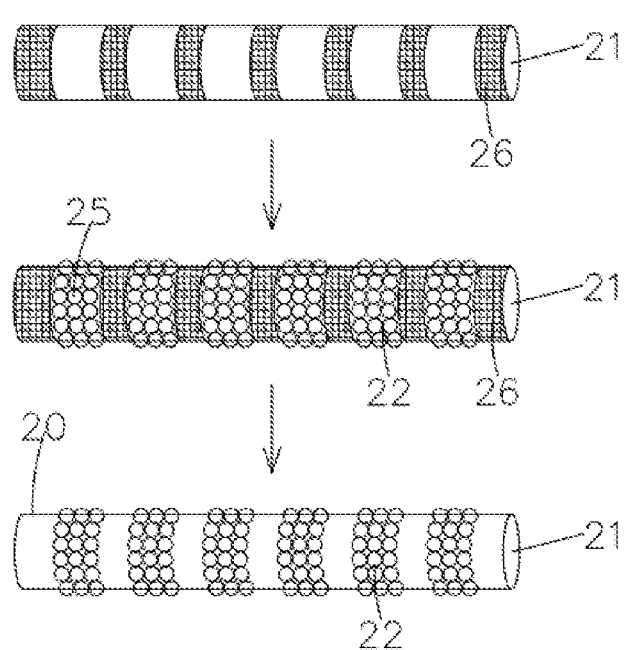
FIG. 10 is a schematic view showing the step S1 of the method of fabricating an anisotropic conductive film according to the second embodiment of the present invention.

As shown in FIG. 10, in this embodiment, the process of fabricating the composite fibers 20 in the step S1 specifically includes the following steps:

Step S11, providing the electrically insulating fiber 21, performing surface modification on the electrically insulating fiber 21, and forming a masking pattern layer 26 on a surface of the electrically insulating fiber 21.

Step S12, providing the conductive particles 25, so that the conductive particles 25 are adsorbed on the surface of the electrically insulating fiber 21 that is not covered by the masking pattern layer 26 by electrostatic action, to form the plurality of conductive rings 22 circling the electrically insulating fiber 21 and arranged along the axial direction of the electrically insulating fiber 21.

Step S13, removing the masking pattern layer 26 to obtain the composite fiber 20.

Other technical features of this embodiment are the same as those of the foregoing first embodiment, and are not repeated herein for brevity.

According to the method of fabricating the anisotropic conductive film of the present invention, the prepared anisotropic conductive film can achieve a good bonding effect on the electrode bump having a small area, thereby realizing design of more drive lines on the display panel, thus effectively improving resolution of a display panel.

In summary, the anisotropic conductive film of the present invention includes a resin base tape and a plurality of composite fibers disposed laterally in the resin base tape, wherein each of the composite fibers includes an electrically insulating fiber and a plurality of conductive rings circling the electrically insulating fiber, the conductive rings including a plurality of conductive particles collectively surrounding the electrically insulating fiber by adsorption, wherein the plurality of composite fibers are periodically arranged in the resin base tape along the extending direction of the resin base tape, and the plurality of conductive rings on each of the composite fibers are periodically arranged along the axial direction of the electrically insulating fiber thereof. Since the conductive rings are fixed on a surface of the electrically insulating fiber, the conductive rings and the electrically insulating fiber are not easily extruded outside of an electrode bump when the bonding is performed, and the electrode bump and the conductive rings may have good contact even when an area of the electrode bump is reduced. As such, more drive lines can be designed on the display panel, which can effectively improve resolution of a display panel. In the method of fabricating the anisotropic conductive film of the present invention, the prepared anisotropic conductive film can achieve a good bonding effect on the electrode bump having a small area, thereby realizing design of more drive lines on the display panel.

While the present invention has been described by way of example and in terms of the preferred embodiments, it is to be understood that the present invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An anisotropic conductive film, comprising a resin base tape and a plurality of composite fibers oriented laterally to a direction of the resin base tape and disposed periodically along an extending direction of the resin base tape,
   wherein each of the composite fibers comprises an electrically insulating fiber and a plurality of conductive rings circling the electrically insulating fiber and arranged along an axial direction of the electrically insulating fiber, and
   the conductive rings comprise a plurality of conductive particles collectively surrounding the electrically insulating fiber by adsorption.

2. The anisotropic conductive film according to claim 1, further comprising a separation layer disposed on upper and lower surfaces of the resin base tape, wherein the separation layer has a thickness of 2-3 μm.

3. The anisotropic conductive film according to claim 1, wherein each of the conductive particles has a shape of a sphere, a cuboid or a cone having an equivalent particle diameter of 5 to 100 nm.

4. The anisotropic conductive film according to claim 1, wherein the electrically insulating fiber has a length of 10-5000 μm.

5. The anisotropic conductive film according to claim 1, wherein each of the conductive rings has a width of 50 to 1000 nm, and a space between two adjacent conductive rings of each of the composite fibers has a width of 500-5000 nm.

6. The anisotropic conductive film according to claim 1, wherein a space between two adjacent composite fibers in the resin base tape has a width of 1-10 μm.

* * * * *